United States Patent
Cho

(10) Patent No.: US 7,241,684 B2
(45) Date of Patent: Jul. 10, 2007

(54) METHOD OF FORMING METAL WIRING OF SEMICONDUCTOR DEVICE

(75) Inventor: Joon-Yeon Cho, Chungcheongbuk-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/024,631

(22) Filed: Dec. 30, 2004

(65) Prior Publication Data

US 2005/0142850 A1 Jun. 30, 2005

(30) Foreign Application Priority Data

Dec. 31, 2003 (KR) ............... 10-2003-0101834

(51) Int. Cl.
*H01L 21/4763* (2006.01)

(52) U.S. Cl. .............. 438/638; 438/623; 438/624; 438/637; 257/E21.495

(58) Field of Classification Search ............. 438/638, 438/624
See application file for complete search history.

(56) References Cited

U.S. PATENT DOCUMENTS

| 5,877,092 | A | * | 3/1999 | Lee et al. ............... 438/738 |
| 6,271,117 | B1 | * | 8/2001 | Cherng ..................... 438/624 |
| 6,287,955 | B1 | * | 9/2001 | Wang et al. ............... 438/623 |
| 6,503,829 | B2 | * | 1/2003 | Kim et al. ................. 438/637 |
| 6,709,965 | B1 | * | 3/2004 | Chen et al. ................ 438/612 |
| 6,740,599 | B2 | * | 5/2004 | Yamazaki et al. ......... 438/739 |
| 2001/0029100 | A1 | * | 10/2001 | Huang et al. ............. 438/638 |
| 2003/0054629 | A1 | * | 3/2003 | Kawai et al. .............. 438/622 |
| 2003/0224595 | A1 | * | 12/2003 | Smith et al. ............... 438/637 |

FOREIGN PATENT DOCUMENTS

| KR | 1998-0011853 | 4/1998 |
| KR | 2003-0094453 | 12/2003 |

* cited by examiner

*Primary Examiner*—Michael Lebentritt
*Assistant Examiner*—Angel Roman
(74) *Attorney, Agent, or Firm*—Lowe Hauptman & Berner LLP

(57) ABSTRACT

A method for forming a metal wiring of a semiconductor device. The method includes forming an etch stop layer on a semiconductor substrate, forming a first inter metal dielectric on the etch stop layer, and forming a second inter metal dielectric on the first inter metal dielectric. The method also includes forming a first photoresist pattern defining a via hole on the second inter metal dielectric, forming a via hole exposing the etch stop layer using the first photo resist pattern, and forming a second photoresist pattern defining a trench by exposing and developing the first photoresist pattern. The method further includes forming a trench by etching the second inter metal dielectric using the second photoresist pattern as a mask, removing the etch stop layer exposed through the via hole, and forming a metal wiring by filling the via hole and the trench.

6 Claims, 2 Drawing Sheets

METHOD OF FORMING METAL WIRING OF SEMICONDUCTOR DEVICE

BACKGROUND OF THE INVENTION (a) Field of the Invention

The present invention relates to a method for forming metal wiring of a semiconductor device and, in particular, to a method for forming the metal wiring in a semiconductor device through a dual damascene process.

(b) Description of the Related Art

Recently, as semiconductor devices have become highly integrated and process techniques have been enhanced, conventional aluminum wirings are being replaced by copper wirings for improving the device characteristics, such as operation speed and resistance of the device, and parasitic capacitance between the metals.

However, since the copper has very poor etching characteristics, a damascene process has replaced the conventional etching process.

In the damascene process, a dual damascene pattern having trenches for forming via holes and wirings in an inter metal dielectric is formed, and then a copper layer is deposited thickly enough to fill the contact holes. After forming the dual damascene pattern, an annealing process is performed on the copper layer so as to remove the impurities that are intruded during the deposition of the copper layer. A polishing process is carried out on the upper surface of the inter metal dielectric using a chemical mechanical polishing technique. Thus, metal wirings and plugs are formed.

However, the dual damascene technique has a drawback in that the photolithography process should be performed at least twice, since contact holes having different diameters are formed. Accordingly, it takes long time to fabricate the devices, resulting in a reduction of production yield.

SUMMARY OF THE INVENTION

The present invention has been made in an effort to solve the above problem. It is an object of the present invention to provide a method for forming metal wiring of a semiconductor device, which is capable of simplifying a dual damascene process.

In order to achieve the above object, a method for forming metal wiring of the semiconductor device includes forming an etch stop layer on a semiconductor substrate, forming a first inter metal dielectric on the etch stop layer, forming a second inter metal dielectric on the first inter metal dielectric, forming a first photoresist pattern defining a via hole on the second inter metal dielectric, forming a via hole exposing the etch stop layer using the first photo resist pattern, forming a second photoresist pattern defining a trench by exposing and developing the first photoresist pattern, forming a trench by etching the second inter metal dielectric using the second photoresist pattern as a mask, removing the etch stop layer exposed through the via hole, and forming a metal wiring by filling the via hole and the trench.

In an exemplary embodiment, the metal wiring includes a metal layer formed on inner walls of the via hole and the trench, and a second metal layer filled inside the via hole and the trench defined by the first metal layer.

In an exemplary embodiment, the first inter metal dielectric is formed out of an inorganic material, and the second inter metal dielectric is formed out of an organic material having low permittivity.

In an exemplary embodiment, the first metal layer is made out of titanium, and the second metal layer is formed out of copper.

It is to be understood that both the foregoing general description of the invention and the following detailed description are exemplary, but are not restrictive of the invention.

DETAILED DESCRIPTION OF THE INVENTION

Figure 1:
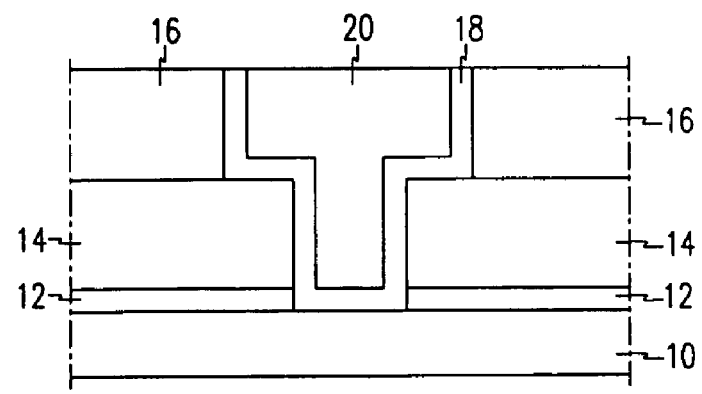
FIG. 1 is a cross sectional view illustrating a metal wiring structure of the semiconductor device according to an exemplary embodiment of the present invention.

With reference to the accompanying drawings, the present invention will be described in order those skilled in the art to be able to implement. However, the invention is not limited to the embodiments to be described hereinafter, but, to the contrary, is intended to cover various modification and equivalent arrangements included within the sprit and scope of the appended claims.

To clarify multiple layers and regions, the thickness of the layers are enlarged in the drawings. Wherever possible, the same reference numbers will be used throughout the drawing(s) to refer to the same or like parts. When it is said any part such as a layer, film, area, or plate is positioned "on" another part, it means the part is right on the other part or above the other part with at least one intermediate part. Further, when it is said that any part is positioned "right on" another part, it means that there is no intermediate part between the two parts (i.e. the parts are in direct contact).

A method for forming metal wiring of a semiconductor device according to an exemplary embodiment of the present invention will be described hereinafter with reference to the accompanying drawings.

FIG. 1 is a cross sectional view illustrating a metal wiring structure of the semiconductor device according to an exemplary embodiment of the present invention.

As shown in FIG. 1, an etch stop layer 12 is formed on a semiconductor substrate 10 having a structure such as metal wirings (not shown) or semiconductor devices. A first inter metal dielectric 14 and a second inter metal dielectric 16 are formed on the etch stop layer 12.

The first inter metal dielectric 14 and the second inter metal dielectric 16 are made from a material having a high etching selectivity. In an exemplary embodiment of the present invention, the first inter metal dielectric 14 is formed out of an inorganic material such as P—SiH$_4$, and the second inter metal dielectric 16 is formed out of an organic high polymer material having low permittivity.

The first and second inter metal dielectrics 14 and 16 are provided with a via hole (V) and a trench (T), which are filled with metal wirings 18 and 20 for forming an electrical connection between the wiring or circuits for the semiconductor device and exterior components. The via hole (V) is formed through the first inter metal dielectric 14 and the etch stop layer 12 so as to expose the substrate 10. The trench (T) is formed through the second inter metal dielectric 16 with a width greater than that of the via hole (V) and exposes the via hole (V).

The metal wirings 18 and 20 include a diffusion protection layer 18 formed along the inner walls of the via hole (V) and the trench (T), and a metal layer 20 filling the via hole (V) and the trench (T) defined by the diffusion protection layer 18. In an exemplary embodiment, the diffusion protection layer 18 is formed out of tantalum silicon nitride (TaSiN), and the metal layer 20 is formed out of a conductive material with a low resistance, such as copper (Cu).

A method for forming the metal wiring of the semiconductor device according to an exemplary embodiment of the present invention will be described hereinafter with reference to FIG. 2 to FIG. 4.

Figure 2:
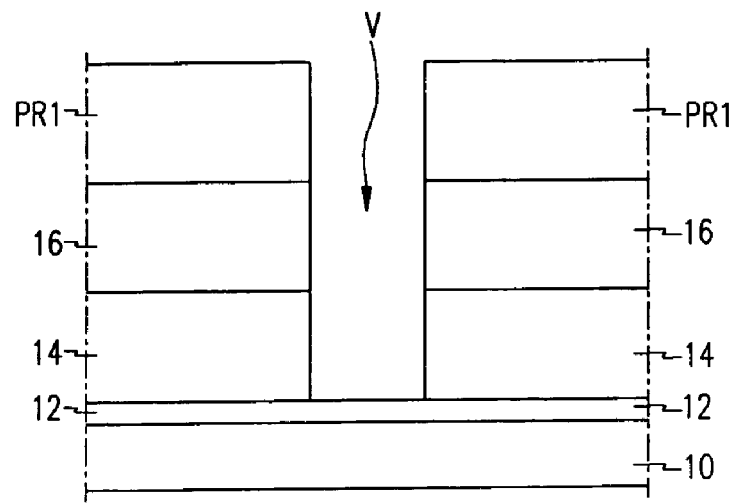
FIG. 2 to FIG. 4 are cross sectional views illustrating fabrication steps of the metal wirings of the semiconductor device according to an exemplary embodiment of the present invention.
Figure 3:
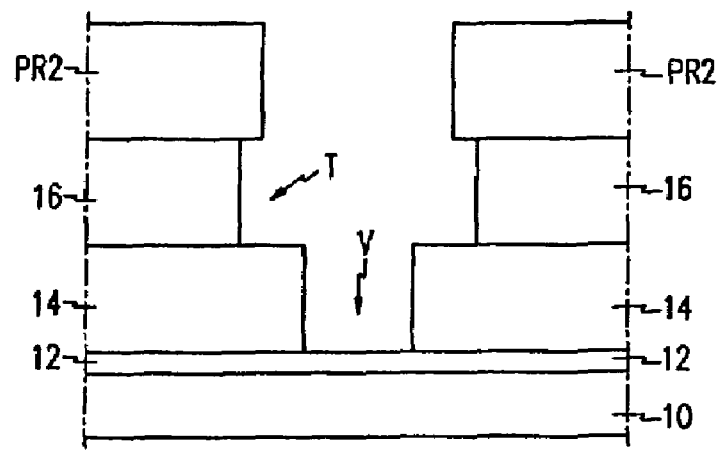
Figure 4:
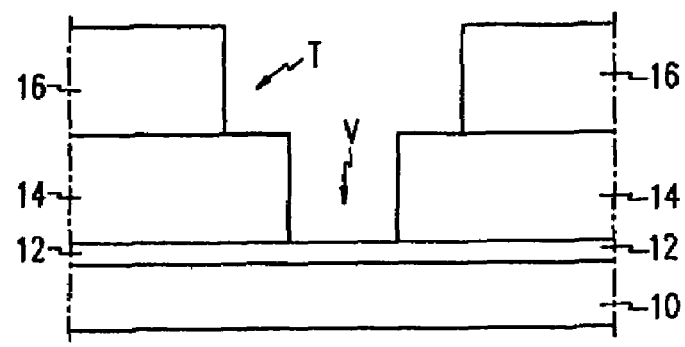

FIG. 2 to FIG. 4 are cross sectional views illustrating fabrication steps of the metal wirings of the semiconductor device according to an exemplary embodiment of the present invention.

Referring to FIG. 2, an etch stop layer 12 is formed on a semiconductor substrate 10 having a structure such as metal wirings (not shown) or semiconductor devices by depositing silicon nitride through a chemical vapor deposition process. An inter metal dielectric 14 is formed on the etch stop layer 12 by depositing an inorganic material such as P—$SiH_4$. Then, a second inter metal dielectric 16 is formed on the first inter metal dielectric 14 by depositing an organic high polymer material having low permittivity.

Next, a photoresist pattern (PR1) is formed by forming a photoresist layer on the second inter metal dielectric 16. The photoresist layer is patterned by a photolithography process using a photo mask for forming a via hole (V). The first and second inter metal dielectrics 14 and 16 are selectively etched using the photoresist pattern (PR) so as to form the via hole (V), which exposes the etch stop layer 12. The photo mask has light permeable portions and light reflective portions. In an exemplary embodiment of the present invention, the portion of the photo resist for defining the via hole (V) is exposed so as to be removed during the following developing process.

In order to reduce the reflectivity if the second inter metal dielectric 16 during the developing process for forming the photoresist pattern (PR1), an antireflective layer (not shown) can be formed on the second inter metal dielectric 16 before forming the first photoresist pattern (PR1). The antireflective layer absorbs the light during the developing process so as to prevent the photoresist of the non-developing region from being damaged by scattered reflection on the upper surface of the inter metal dielectric 16.

Referring to FIG. 3, the photoresist pattern (PR1) depicted in FIG. 2 is exposed through the photomask for forming the trench, and developed such that a second photoresist pattern (PR2) is formed. The second inter metal dielectric 16 is etched through a wet etch process using the second photoresist pattern (PR2) as a mask, such that the trench (T) is formed.

The first inter metal dielectric is formed out of an inorganic material and the second inter metal dielectric is formed out of an organic material having a low permittivity, such that the etching selectivity is large.

Here, the photomask for forming the trench (T) includes a light permeable portion defining the trench (T) and a reflective region except for the trench (T). Accordingly, the photoresist pattern (PR1) is removed at the trench (T). Here, the second inter metal dielectric 16 is wet-etched to the bottom of the second photoresist pattern (PR2) so as to be undercut.

Referring to FIG. 4, after removing the photoresist pattern (PR), the etch stop layer 12 exposed through the via hole (V) is removed so as to expose the substrate 10.

As shown in FIG. 1, the first metal layer is formed on the inner walls of the via hole (V) and the trench (T) by depositing a metal such as titanium or titanium alloy. Next, the via hole (V) and the trench (T) coated by the first metal layer is filled by the second metal layer.

Metal wiring of dual damascene pattern, which fills the via hole and the trench, is formed by performing a chemical mechanical polishing until the surface of the inter metal dielectric 110 is exposed.

As described above, in the present invention the via hole and the trench are formed using a single photoresist pattern such that it is possible to simplify the metal wiring process using the damascene, resulting in reduction of process time, increase of the production yield, and reduction of the whole manufacturing cost.

Korean Patent Application No. 10-2003-0101834, filed on Dec. 31, 2003, is incorporated herein by reference in its entirety.

Although exemplary embodiments of the present invention have been described in detail hereinabove, it should be clearly understood that many variations and/or modifications of the basic invention concepts herein taught which may appear to those skilled in the present art will still fall within the spirit and scope of the present invention, as defined in the appended claims.

What is claimed is:

1. A method for forming a metal wiring of a semiconductor device, comprising steps of:
   forming an etch stop layer on a semiconductor substrate;
   forming a first inter metal dielectric on the etch stop layer, the first inter metal dielectric being formed of an inorganic material;
   forming a second inter metal dielectric on the first inter metal dielectric, the second inter metal dielectric being formed of an organic polymer material having a low permittivity;
   forming a first photoresist pattern defining a via hole on the second inter metal dielectric, wherein the etching selectivity of the second inter metal dielectric to the first inter metal dielectric is high;
   forming a via hole exposing the etch stop layer using the first photoresist pattern;
   forming a second photoresist pattern defining a trench by exposing and developing the first photoresist pattern;
   forming a trench by wet-etching the second inter metal dielectric so as to be undercut using the second photoresist pattern as a mask;
   removing the etch stop layer exposed through the via hole; and
   forming a metal wiring by filling the via hole and the trench.

2. The method of claim 1, wherein the step of forming a metal wiring includes: forming a first metal layer on inner walls of the via hole and the trench; and forming a second metal layer inside the via hole and the trench defined by the first metal layer.

3. The method of claim 2, wherein the first metal layer is made out of titanium, and the second metal layer is formed out of copper.

4. A method for forming a metal wiring of a semiconductor device, comprising:
   a step for forming an etch stop layer on a semiconductor substrate;
   a step for forming a first inter metal dielectric on the etch stop layer, the first inter metal dielectric being formed of an inorganic material;

a step for forming a second inter metal dielectric on the first inter metal dielectric, the second inter metal dielectric being formed of an organic polymer material having a low permittivity;

a step for forming a first photoresist pattern defining a via hole on the second inter metal dielectric, wherein the etching selectivity of the second inter metal dielectric to the first inter metal dielectric is high;

a step for forming a via hole exposing the etch stop layer using the first photoresist pattern;

a step for forming a second photoresist pattern defining a trench by exposing and developing the first photoresist pattern;

a step for forming a trench by wet-etching the second inter metal dielectric so as to be undercut using the second photoresist pattern as a mask;

a step for removing the etch stop layer exposed through the via hole; and a step for forming a metal wiring by filling the via hole and the trench.

5. The method of claim 4, wherein the step for forming a metal wiring includes: a step for forming a first metal layer on inner walls of the via hole and the trench; and a step for forming a second metal layer inside the via hole and the trench defined by the first metal layer.

6. The method of claim 5, wherein the first metal layer is made out of titanium, and the second metal layer is formed out of copper.

* * * * *